US009153454B2

(12) United States Patent
Chen et al.

(10) Patent No.: US 9,153,454 B2
(45) Date of Patent: Oct. 6, 2015

(54) METHOD OF FABRICATING HIGH VOLTAGE DEVICE

(71) Applicant: UNITED MICROELECTRONICS CORP., Hsin-Chu (TW)

(72) Inventors: Yi-Hao Chen, Changhua County (TW); Wen-Yu Lee, Hsinchu County (TW); Hsiao-Wen Liu, New Taipei (TW); Jung-Ching Chen, Taichung (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 17 days.

(21) Appl. No.: 13/918,993

(22) Filed: Jun. 17, 2013

(65) Prior Publication Data

US 2014/0370680 A1 Dec. 18, 2014

(51) Int. Cl.
*H01L 21/308* (2006.01)
*H01L 29/66* (2006.01)
*H01L 29/78* (2006.01)

(52) U.S. Cl.
CPC ...... *H01L 21/3083* (2013.01); *H01L 29/66598* (2013.01); *H01L 29/7833* (2013.01)

(58) Field of Classification Search
None
See application file for complete search history.

(56) References Cited

U.S. PATENT DOCUMENTS

2003/0104670 A1* 6/2003 Wu ............................... 438/257
2013/0029490 A1* 1/2013 Lee et al. ...................... 438/694

* cited by examiner

*Primary Examiner* — Alexander Ghyka
(74) *Attorney, Agent, or Firm* — Winston Hsu; Scott Margo

(57) ABSTRACT

A method of fabricating a high voltage device includes the step of forming a patterned photoresist layer on a conductive layer and a dielectric below the conductive. The conductive layer and the dielectric layer are patterned by taking the patterned photoresist layer as a mask. Subsequently the patterned photoresist layer is shrunk. The conductive layer and the dielectric layer are then patterned by taking the shrunk photoresist layer as a mask.

8 Claims, 6 Drawing Sheets

METHOD OF FABRICATING HIGH VOLTAGE DEVICE

BACKGROUND OF THE INVENTION

1. Field of the Invention

The present invention relates to a method for fabricating a semiconductor device, and more particularly to a method for fabricating a high voltage transistor.

2. Description of the Prior Art

Every electrical device has a particular working voltage and frequency condition; therefore, electrical devices and related passive elements utilized in the electrical devices, such as inductors, capacitors, resistors and transformers, act as a switch to determine the value of the voltage and the type of current thereof. High voltage transistors may also function as switches and are broadly utilized in CPU power supplies, power management systems, AC/DC converters, LCD/plasma TV drivers, automobile electronic components, PC peripheral devices, small DC motor controllers, and other consumer electronic devices.

A high-voltage transistor may include a gate, a channel formed under the gate, source/drain regions formed on both sides of the channel, and a drift region for distributing an electric field applied to the source/drain regions at the time a device is driven.

In high voltage applications, the transistor is designed to withstand high voltages. Due to their structural design, however, a current leakage problem may occur through the gate dielectric layer.

SUMMARY OF THE INVENTION

In this regard, there is a need for a high voltage transistor with low current leakage. The high voltage transistor can be conventionally integrated using well known integrated device processes.

According to a first embodiment of the present invention, a method of fabricating a high voltage device includes the steps of providing a substrate having a dielectric layer, a conductive layer and a photoresist layer disposed on the substrate from bottom to top. The photoresist layer is patterned to form a patterned photoresist layer having a first width. Subsequently, a first patterning step is performed to pattern the conductive layer and the dielectric layer by taking the patterned photoresist layer as a first mask. Later, the first width of the patterned photoresist layer is shrunk to a second width. Thereafter, a second patterning step is performed to pattern the conductive layer and the dielectric layer by taking the shrunk photoresist layer as a second mask so as to form the dielectric layer into a step profile. Finally, the shrunk photoresist layer is removed.

According to a second embodiment of the present invention, a method of fabricating a high voltage device includes the steps of providing a substrate having a dielectric layer, a conductive layer and a first photoresist layer disposed on the substrate from bottom to top. The first photoresist layer is patterned to form a first patterned photoresist layer by utilizing a photo mask and a first exposure energy. After that, a first patterning step is performed to pattern the conductive layer and the dielectric layer by taking the first patterned photoresist layer as a first mask. Later, the first patterned photoresist layer is removed.

Subsequently, a second photoresist layer is formed on the conductive layer. The second photoresist layer is patterned to form a second patterned photoresist layer by utilizing the photo mask and a second exposure energy. Thereafter, a second patterning step is performed to pattern the conductive layer and the dielectric layer by taking the second patterned photoresist layer as a second mask so as to form the dielectric layer into a step profile. Finally, the second patterned photoresist layer is removed.

These and other objectives of the present invention will no doubt become obvious to those of ordinary skill in the art after reading the following detailed description of the preferred embodiment that is illustrated in the various figures and drawings.

DETAILED DESCRIPTION

FIGS. 1 to 4 and 6 are schematic cross-sectional views illustrating a process of manufacturing a high-voltage transistor according to a first embodiment of the present invention.

Figure 1:
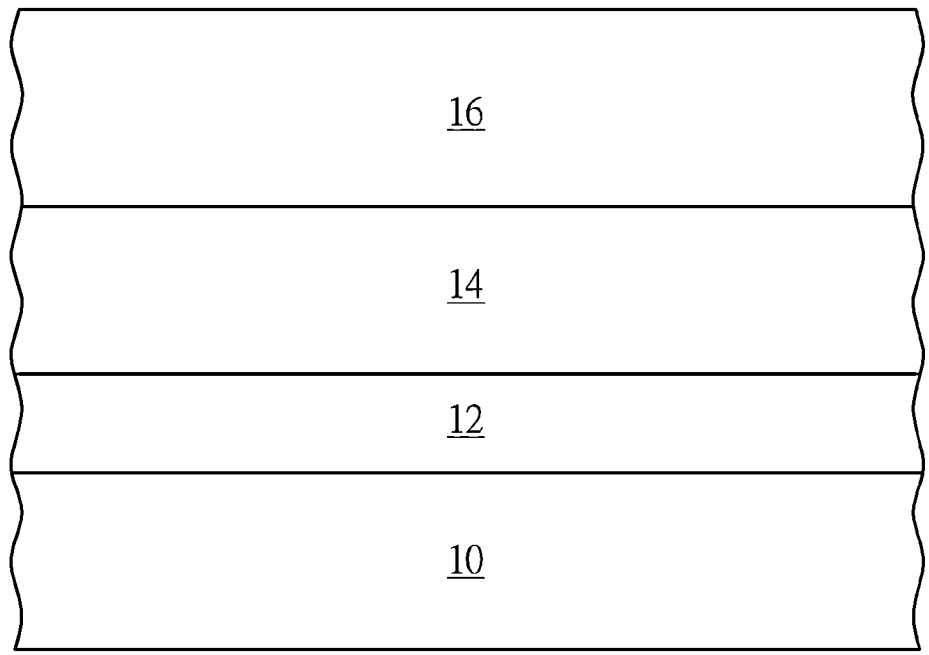
FIGS. 1 to 4 and 6 are schematic cross-sectional views illustrating a process of manufacturing a high-voltage transistor according to a first embodiment of the present invention.

First, as illustrated in FIG. 1, a substrate 10 is provided. The substrate 10 may be a bulk silicon substrate, a germanium substrate, a gallium arsenide substrate, a silicon germanium substrate, an indium phosphide substrate, a gallium nitride substrate, a silicon carbide substrate, or a silicon on insulator (SOI) substrate. A dielectric layer 12 and a conductive layer 14 are formed on the substrate 10 from bottom to top. The dielectric layer 12 may be silicon nitride, silicon oxide or other insulating layer. The conductive layer 14 may be doped polysilicon, metal or other conductive materials.

Figure 2:
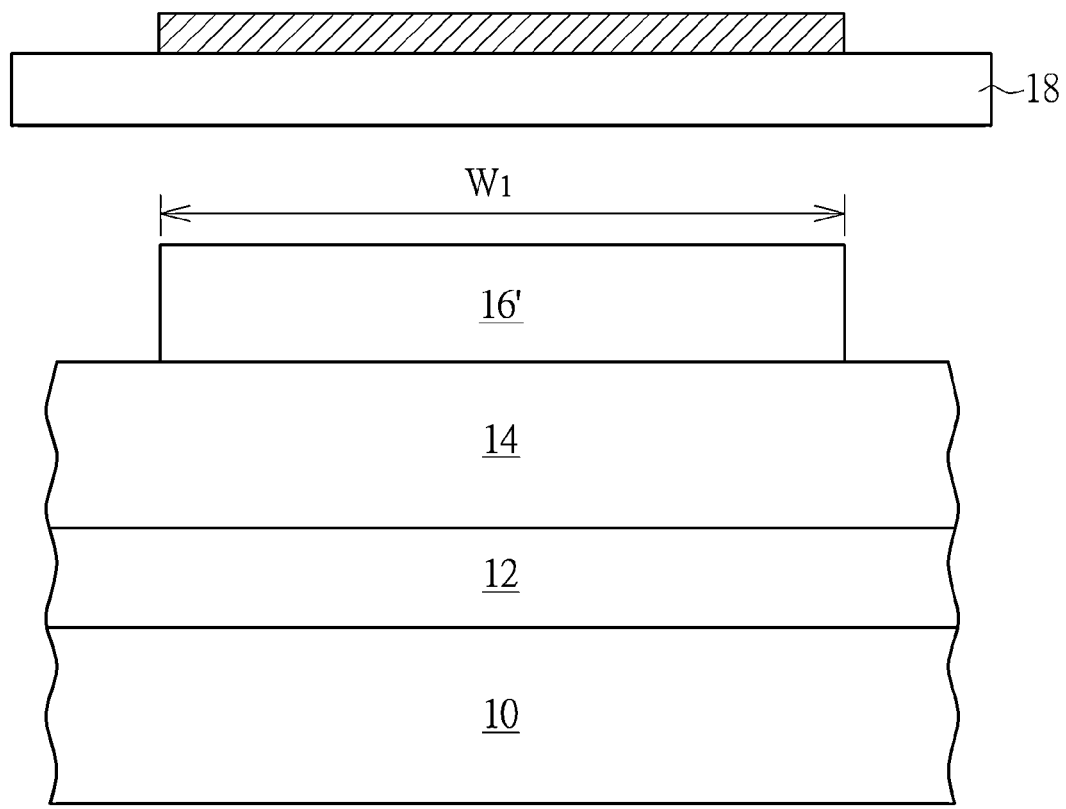

A photoresist 16 may be applied onto the conductive layer 14. The thickness of the photoresist 16 may be 4 to 5 micrometers, but the invention is not limited herein. The thickness of the photoresist 16 can be adjusted duo to different product requirements. As shown in FIG. 2, the photoresist 16 may be patterned by using a photo mask 18 to form a patterned photoresist 16' having a first width $W_1$ to cover part of the conductive layer 14, and the other part of the conductive layer 14 is exposed. The thickness of the patterned photoresist 16' can be adjusted due to different product requirements.

Figure 3:
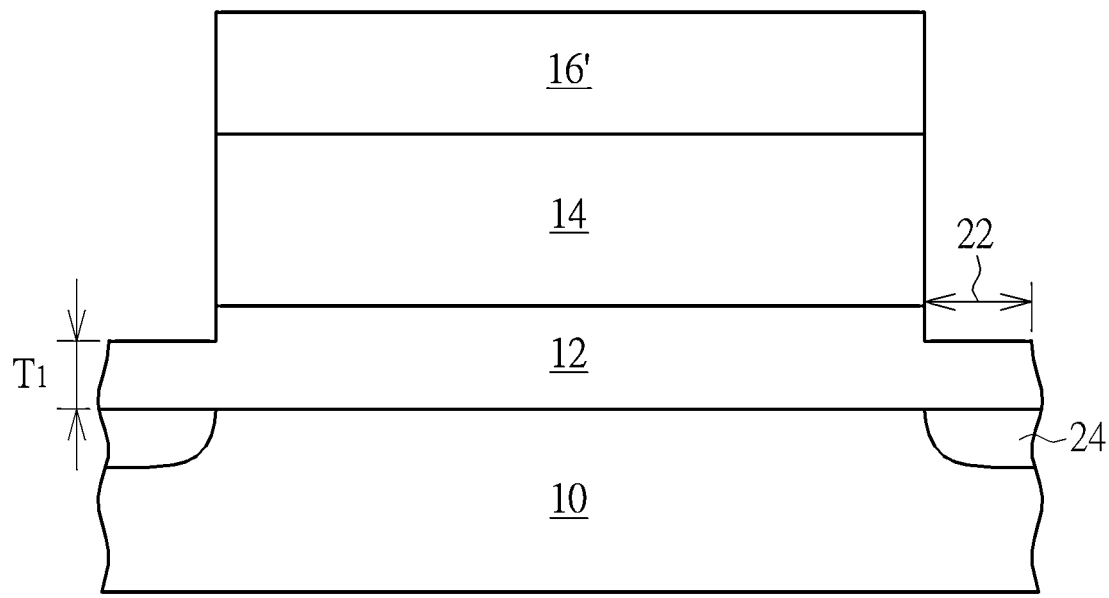

As shown in FIG. 3, a first patterning step is performed by taking the patterned photoresist 16' as a mask. During the first patterning step, the exposed part of the conductive layer 14 is removed and a first portion 22 of the dielectric layer 12 which is originally under the exposed conductive layer 14 is exposed. The first patterning step continues to remove the first portion 22 of the dielectric layer 12 until the first portion 22 of the dielectric layer 12 has a first thickness $T_1$. The first patterning step may be an etch process. Subsequently, N-type dopants or P-type dopants may be optionally ion-implanted in to the substrate 10 to form two lightly doped source/drains 24 in the substrate 10 at two sides of the conductive layer 14 respectively. The implantation energy for N-type dopants such as phosphorous or arsenic is about 1 to 20 Kev, and dosage is about $1E11/cm^2$ to $5E15/cm^2$. The implant energy for P-type dopants such as boron is about 1 to 20 Kev, and dosage is about $1E11/cm^2$ to $5E15/cm^2$. The implantation dosage and energy herein are only for exemplary purposes. Based on different product requirements, the implantation dosage and energy can be adjusted.

Because the dopants need to penetrate the first portion 22 of the dielectric layer 12 before entering the substrate 10, the first thickness $T_1$ of the dielectric layer 12 is one of the parameters to control the depth of the lightly doped source/drain regions 24.

Figure 4:
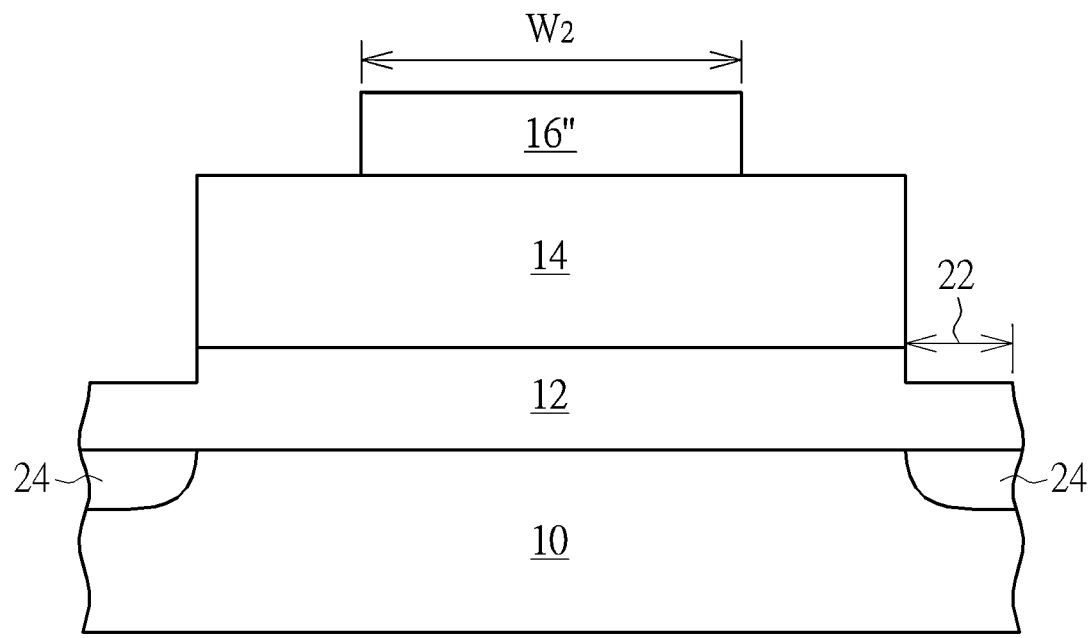
Figure 5:
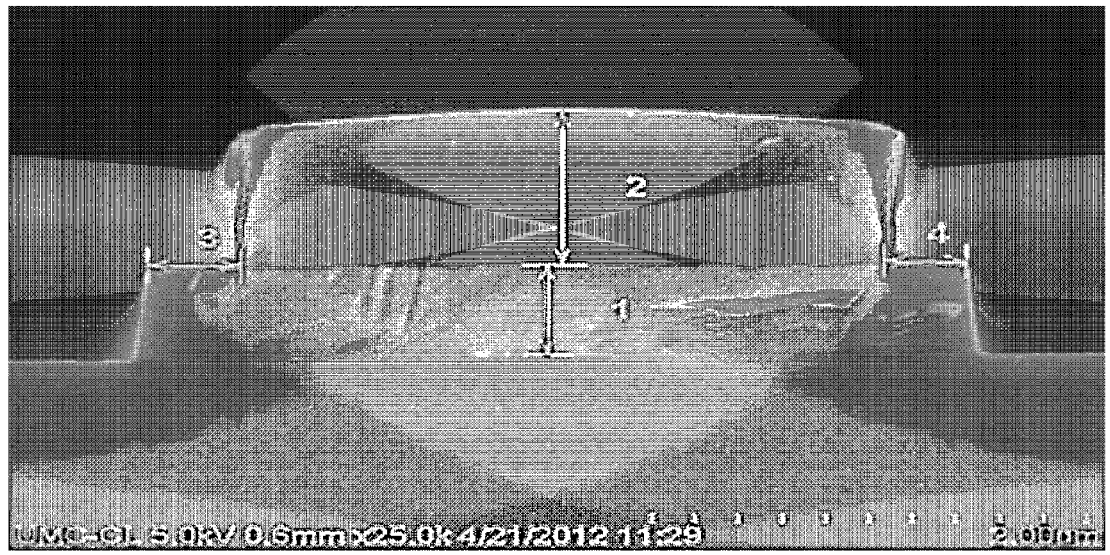
FIG. 5 is a SEM picture showing the shrunk photoresist on the conductive layer after the shrinking step, according to the present invention.

As shown in FIG. 4, the patterned photoresist 16' is shrunk to form a shrunk photoresist 16" having a second width $W_2$. Preferably, the shrinking step is accomplished by plasma. The second width $W_2$ is smaller than the first width $W_1$, and the thickness of the shrunk photoresist 16" is preferably 1 to 2 micrometers, but the invention is not limited herein. The thickness of the shrunk photoresist 16" can be adjusted due to different product requirements. At this point, part of the conductive layer 14 and the first portion 22 of the dielectric layer 12 are exposed through the shrunk photoresist 16". FIG. 5 is a SEM picture showing the shrunk photoresist on the conductive layer after the shrinking step according to the present invention. The topmost layer is the shrunk photoresist, and the conductive layer is directly under the shrunk photoresist.

Figure 6:
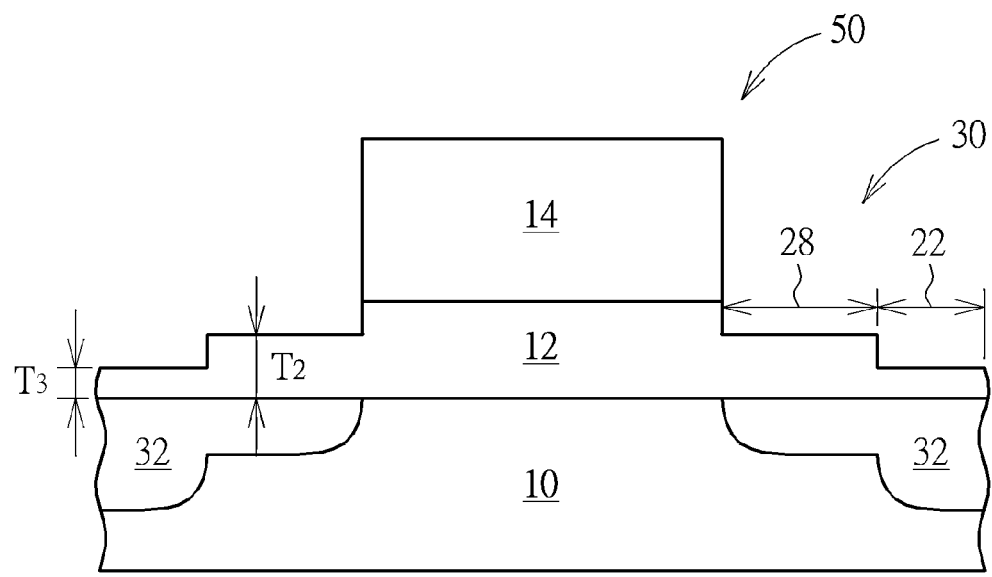

As shown in FIG. 6, a second patterning step is performed to remove the exposed portion of the conductive layer 14 by taking the shrunk photoresist 16" as a mask. The second patterning step is preferably performed by an etching step. During the removal of the exposed portion of the conductive layer 14, the first portion 22 of the dielectric layer 12 is also etched to a third thickness $T_3$. Later, a second portion 28 of the dielectric layer 12 originally under the exposed portion of conductive layer 14 is exposed. The second patterning step continues to remove the second portion 28 of the dielectric layer 12 until the second portion 28 of the dielectric layer 12 has a second thickness $T_2$, which is larger than a third thickness $T_3$. Thereafter, the shrunk photoresist 16" is removed. At this point, the first portion 22 of the dielectric layer 12, the second portion 28 of the dielectric layer 12 and the dielectric layer 12 directly under the conductive layer 14 forms a step profile 30. The step profile 30 goes upwardly from the first portion 22 to the second portion 28. The dielectric layer 12 directly under the conductive layer 14 serves as a gate electric layer, and the conductive layer 14 serves as a gate. The first portion 22 of the dielectric layer 12 extends from the second portion 28 of the dielectric layer 12, and the second portion 28 is nearer to the conductive layer 14 than the first portion 22. Finally, N-type dopants or P-type dopants may be ion-implanted into the substrate 10 to form two source/drain regions 32 in the substrate 10 at two sides of the conductive layer 14 respectively. The implant energy for N-type dopants such as phosphorous or arsenic is about 20 to 100 Kev, and dosage is about $1E13/cm^2$ to $5E16/cm^2$. The implant energy for P-type dopants such as boron is about 20 to 100 Kev, and dosage is about $1E13/cm^2$ to $5E16/cm^2$. The source/drain regions 32 will overlap with the lightly doped source/drain regions 24.

The implantation dosage and energy herein are only for giving an example. Based on different product requirements, the implantation dosage and energy can be adjusted. Because the first portion and the second portion of the dielectric layer have different thicknesses, the depths of the dopants may vary corresponding to the different thicknesses. At this point, a high voltage device 50 such as a high voltage transistor is completed.

Figure 7:
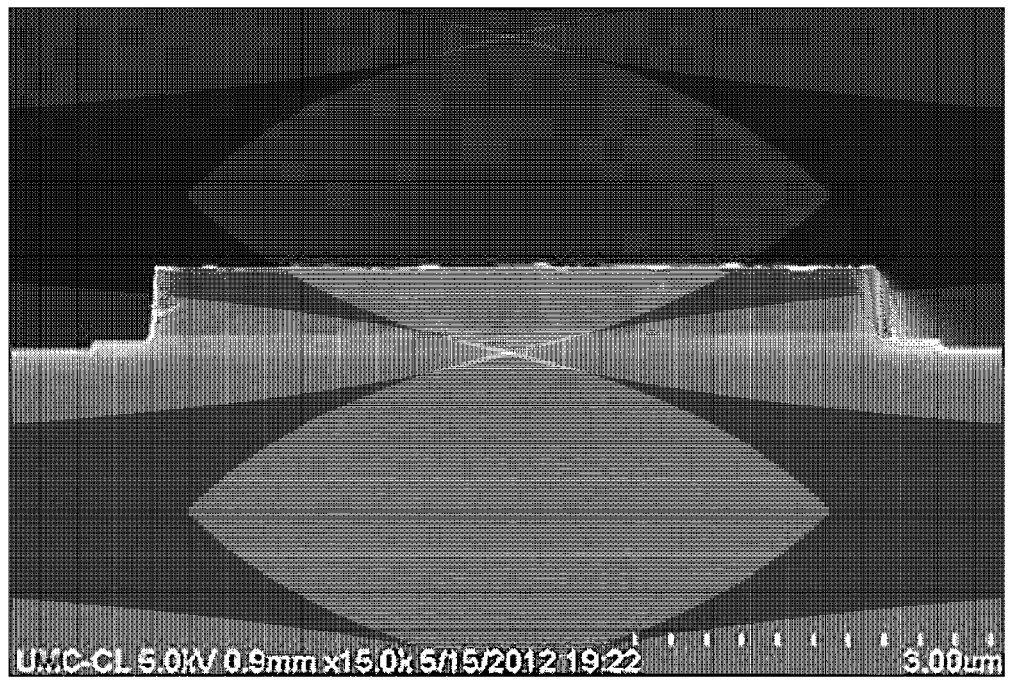
FIG. 7 is a SEM picture showing the conductive layer and the step profile obtained by the method according to the first embodiment of the present invention.
Figure 8:
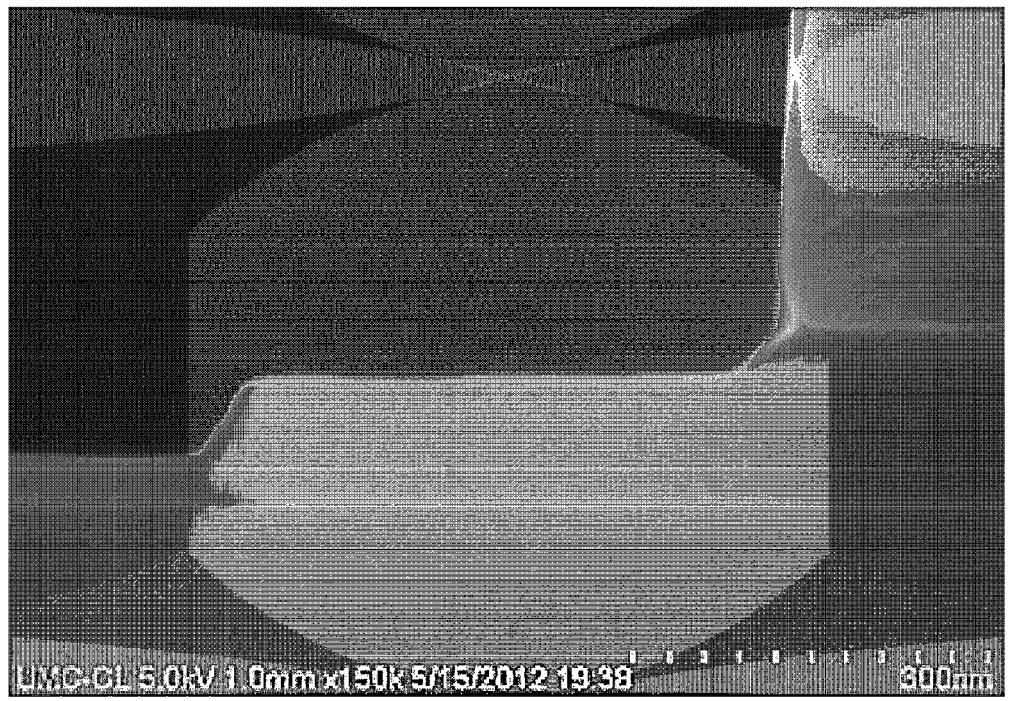
FIG. 8 is a SEM picture showing a magnified view of the step profile in FIG. 7.

FIG. 7 is a SEM picture showing the conductive layer and the step profile obtained by the method according to the first embodiment of the present invention. FIG. 8 is a SEM picture showing a magnified view of the step profile. According to the first embodiment of the present invention, the high voltage device 50 is completed by using one photo mask 18, and one photoresist layer 16. The width of the photoresist layer 16 is changed by the shrinking step so as to form the step profile 30 on the dielectric layer 12.

FIGS. 1, 6, 9, 10 and 11 are schematic cross-sectional views illustrating a process of manufacturing a high-voltage transistor according to a second embodiment of the present invention, wherein elements which are substantially the same as those in the first embodiment are denoted by the same reference numerals; an accompanying explanation is therefore omitted, and unless otherwise specified, elements denoted by the same reference numerals are formed by the same method as those in the first embodiment. Please refer to the corresponding paragraphs for details.

Figure 9:
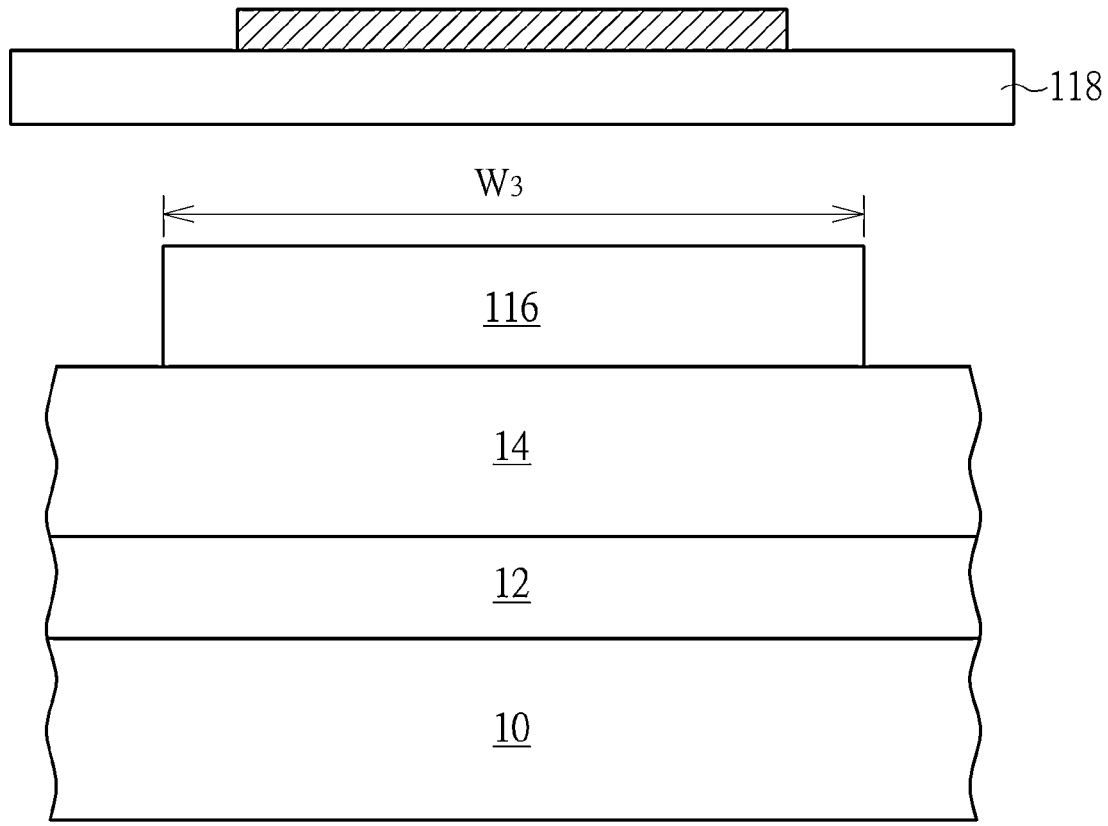
FIGS. 9 to 11 are schematic cross-sectional views illustrating a process of manufacturing a high-voltage transistor according to a second embodiment of the present invention.
Figure 10:
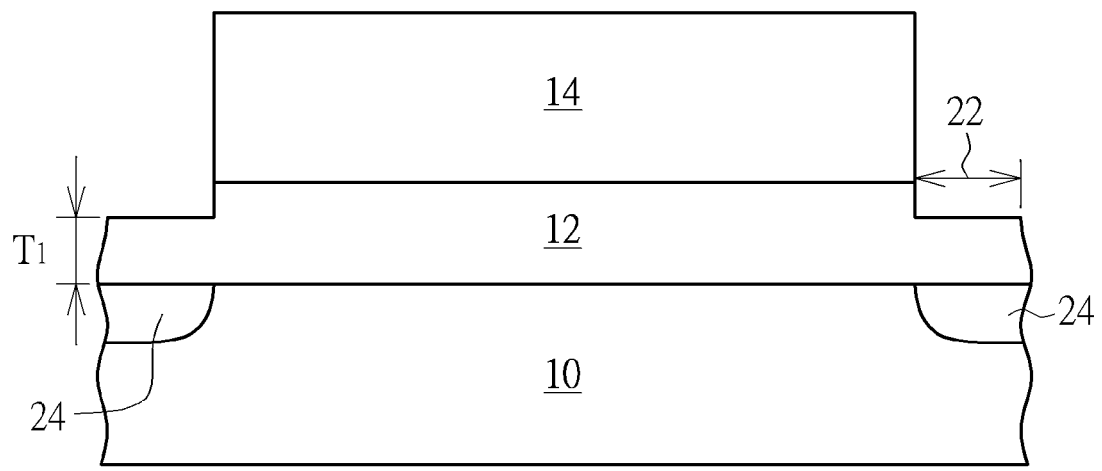

As shown in FIG. 1, a substrate 10 is provided. Then a dielectric layer 12, a conductive layer 14 and a photoresist layer 16 are formed on the substrate 10 from bottom to top. As shown in FIG. 9, the photoresist layer 16 is patterned by utilizing a photo mask 118 and a first exposure energy to formed a patterned photoresist 116 having a third width $W_3$ to cover part of the conductive layer 14, and the other part of the conductive layer 14 is exposed. As shown in FIG. 10, a first patterning step is performed by taking the patterned photoresist 116 as a mask. After the first patterning step, part of the conductive layer 14 is removed, and a first portion 22 of the dielectric layer 12 is etched to a first thickness $T_1$. Subsequently, the patterned photoresist 116 is removed. Thereafter, two lightly doped source/drain regions 24 are optionally formed in the substrate 10 at two sides of the conductive layer 14 respectively.

Figure 11:
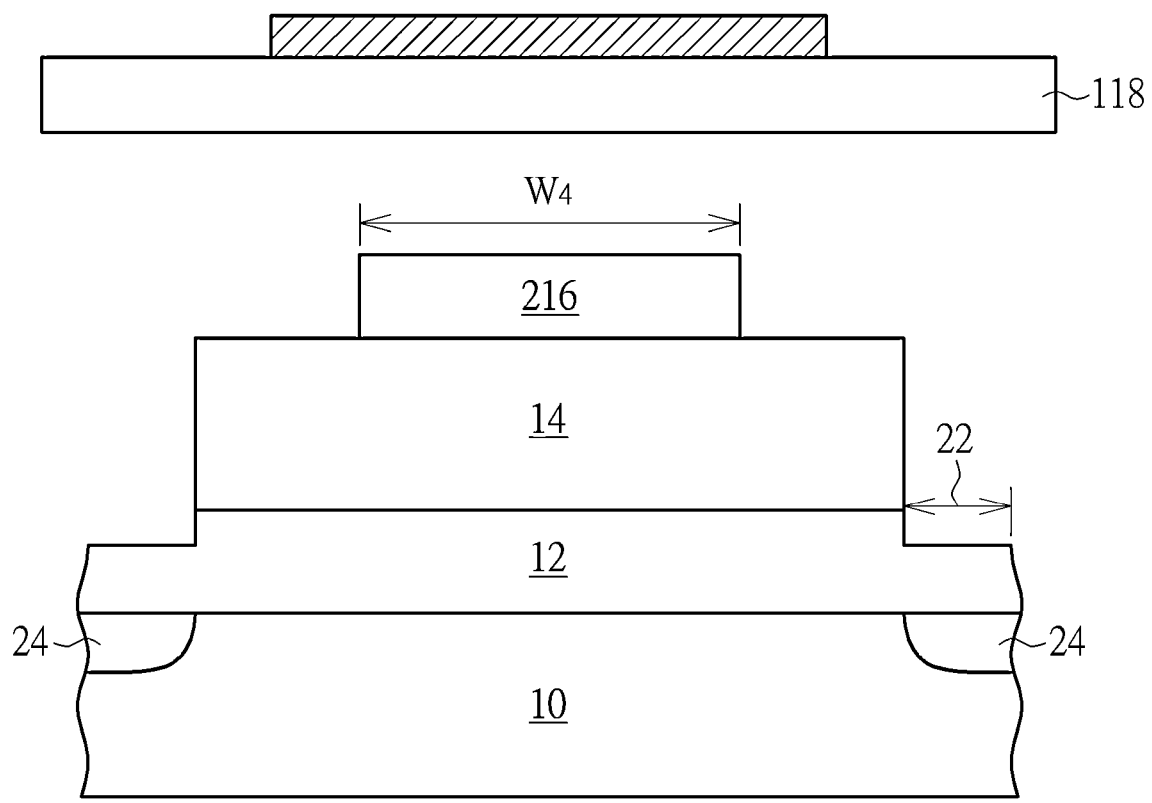

As shown in FIG. 11, another photoresist layer (not shown) is formed on the conductive layer 14. The photoresist layer is patterned to form a patterned photoresist layer 216 having a fourth width $W_4$ by using the aforesaid photo mask 118 accompanied with a second exposure energy. The second exposure energy is different from the first exposure energy. Preferably the second exposure energy is greater than the first exposure energy. Moreover, the fourth width $W_4$ of the patterned photoresist layer 216 is smaller than the third width $W_3$ patterned photoresist layer 116. As shown in FIG. 6, a second patterning step is performed to remove part of the conductive layer 14 by taking the patterned photoresist 216 as a mask. During the removal of the exposed portion of the conductive layer 14, the first portion 22 of the dielectric layer 12 is also etched to a third thickness $T_3$. Later, a second portion 28 of the dielectric layer 12 originally under the conductive layer 14 is exposed. The second patterning step continues to remove the second portion 28 of the dielectric layer 12 until the second portion 28 of the dielectric layer 12 has a second thickness $T_2$, which is larger than a third thickness $T_3$. Thereafter, the patterned photoresist 216 is removed. At this point, the first portion 22 of the dielectric layer 12, the second portion 28 of the dielectric layer 12 and the dielectric layer 12 directly under the conductive layer 14 forms a step profile 30. The first portion 22 of the dielectric layer 12 extends from the second portion 28 of the dielectric layer 12, and the second portion 28 is nearer to the conductive layer 14 than the first portion 22. Later, two source/drain regions 32 are formed in the substrate 10 at two sides of the conductive layer 14 respectively. At this point, a high voltage device 50 such as a high voltage transistor is completed. According to the second embodiment of the present invention, the high voltage device is completed by using one photo mask 118, and two photoresist layers 116/216. The width of the photoresist layers 116/216 can be adjusted by the exposure energy.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a high voltage device, comprising:
   providing a substrate having a dielectric layer, a conductive layer and a photoresist layer disposed on the substrate from bottom to top;
   patterning the photoresist layer to form a patterned photoresist layer having a first width;
   performing a first patterning step to pattern the conductive layer and the dielectric layer by taking the patterned photoresist layer as a first mask;
   forming two lightly doped source/drain regions in the substrate at two sides of the conductive layer by implanting dopants into the substrate, and wherein dopants penetrate the dielectric layer before entering the substrate;
   after forming the lightly doped source/drain regions, shrinking the first width of the patterned photoresist layer to a second width;
   performing a second patterning step to pattern the conductive layer and the dielectric layer by taking the shrunk photoresist layer as a second mask so as to form the dielectric layer into a step profile; and
   removing the shrunk photoresist layer.

2. The method of fabricating a high voltage device claim 1, further comprising:
   after removing the shrunk photoresist layer, forming two source/drain regions in the substrate at two sides of the conductive layer.

3. The method of fabricating a high voltage device claim 1, wherein the shrinking step is performed by using plasma.

4. The method of fabricating a high voltage device claim 1, wherein the step profile comprises a second portion of the dielectric layer adjacent to the conductive layer and a first portion of the dielectric layer extending from the second portion, and the second portion has a second thickness greater than a third thickness of the first portion.

5. The method of fabricating a high voltage device claim 1, wherein the second width is smaller than the first width.

6. The method of fabricating a high voltage device claim 1, wherein during the first patterning step, part of the conductive layer is removed and a first portion of the dielectric layer is etched to a first thickness.

7. The method of fabricating a high voltage device claim 1, wherein during the second patterning step, another part of the conductive layer is removed, a second portion of the dielectric layer is etched to a second thickness, and the first portion is etched to a third thickness, wherein the second thickness is larger than the third thickness.

8. The method of fabricating a high voltage device claim 7, wherein the second portion is nearer to the conductive layer than the first portion.

* * * * *